(12) United States Patent
Pai

(10) Patent No.: US 7,012,667 B2
(45) Date of Patent: Mar. 14, 2006

(54) LIQUID CRYSTAL DISPLAY DEVICE

(75) Inventor: Feng Ting Pai, Shinchu (TW)

(73) Assignee: Hannstar Display Corp., (TW)

( * ) Notice: Subject to any disclaimer, the term of this patent is extended or adjusted under 35 U.S.C. 154(b) by 104 days.

(21) Appl. No.: 10/345,255

(22) Filed: Jan. 16, 2003

(65) Prior Publication Data

US 2004/0027527 A1    Feb. 12, 2004

Related U.S. Application Data

(63) Continuation-in-part of application No. 10/286,762, filed on Nov. 4, 2002, now abandoned.

(30) Foreign Application Priority Data

Aug. 8, 2002    (TW) ................................ 91118132 A

(51) Int. Cl.
*G02F 1/1345*    (2006.01)
(52) U.S. Cl. ...................... 349/152; 349/150; 349/151
(58) Field of Classification Search ................ 349/149, 349/150, 151, 152; 345/87
See application file for complete search history.

(56) References Cited

U.S. PATENT DOCUMENTS

| | | | | |
|---|---|---|---|---|
| 6,160,605 A * | 12/2000 | Murayama et al. | .......... | 349/152 |
| 6,507,384 B1 * | 1/2003 | Endo et al. | .................. | 349/149 |
| 6,583,844 B1 * | 6/2003 | Mishima et al. | ............ | 349/149 |
| 6,657,696 B1 * | 12/2003 | Aruga | ......................... | 349/150 |
| 6,697,041 B1 * | 2/2004 | Tamai et al. | ................. | 345/100 |
| 6,734,940 B1 * | 5/2004 | Hirabayashi | ................. | 349/149 |
| 6,750,926 B1 * | 6/2004 | Ohgiichi et al. | .............. | 349/40 |

* cited by examiner

*Primary Examiner*—Dung T. Nguyen
*Assistant Examiner*—David Y. Chung

(57) ABSTRACT

A liquid crystal display device comprises a liquid crystal panel, a flexible printed circuit (FPC) film connecting to the liquid crystal panel, and a plurality of driver IC chips formed on the liquid crystal panel directly. The present invention is characterized in that a power circuit, a gamma compensating circuit and a ground circuit are formed on the FPC film and are electrically connected to each of the driver IC chips respectively and that the driver IC chips are formed on the glass substrate of the liquid crystal panel directly to save the space of the PCB and lower the cost.

18 Claims, 5 Drawing Sheets

LIQUID CRYSTAL DISPLAY DEVICE

RELATED APPLICATIONS

This application is a continuation-in-part of U.S. Ser. No. 10/286,762, entitled Liquid Crystal Display Device, filed on Nov. 4, 2002 abandoned.

BACKGROUND OF THE INVENTION

1. Field of the Invention

The invention relates to a liquid crystal display device in which drive integrated circuit (IC) chips are mounted on a glass substrate of a liquid crystal panel.

2. Description of the Related Art

As shown in FIG. 1, it shows a conventional liquid crystal display device 10 which mainly comprises a liquid crystal panel 100, a plurality of tape carrier packages (TCPs) 102, and common printed wiring boards 104. The liquid crystal panel 100 has a matrix array of pixel electrodes, a plurality of scanning lines formed along rows of the pixel electrodes, and a plurality of signal lines formed along columns of the pixel electrodes. The common printed wiring board 104 has a driving circuit for transmitting control signals and driving the driver IC chips 106, 108 mounted on the tape carrier packages 102 such that the driver IC chips 106 drive each of the scanning lines to select a row of the pixel electrodes, and the driver IC chips 108 drive the signal lines to control voltages across the pixel electrodes of the selected row.

More specifically, as shown in FIG. 2, the driving circuit of the common printed wiring board is connected to the driver IC chips 108, which is used in driving the signal lines, through common bus lines disposed on the tape carrier packages 102. The common bus lines include power lines VDD and ground lines GND, data lines DATA and control signal lines CNT.

However, the liquid crystal display device with the above-described tape carrier packages and common printed wiring boards has the following drawbacks. Firstly, an increase in the dimensions of the frame region of the liquid crystal panel is required in order to connect the plurality of tape carrier packages. Secondly, the minimization of the liquid crystal display device or dimension of the display area of the liquid crystal panel is limited by an occupied space of the tape carrier packages and the common printed wiring board. Lastly, in a liquid crystal module assembling process, the common printed wiring boards are bent to the back of the liquid crystal panel such that the thickness of the liquid crystal panel is unable to be decreased effectively.

SUMMARY OF THE INVENTION

It is an object of the present invention to provide a compact liquid crystal display device, in which the driving IC chips are disposed on the glass substrate of the liquid crystal panel directly so as to save the space of the PCB and lower the manufacturing cost of the printed circuit board (PCB) and the materials cost of the tape carrier packages.

In order to achieve the above object, the present invention mainly provides a liquid crystal display device comprising a liquid crystal panel, a flexible printed circuit (FPC) film connecting to the liquid crystal panel, and a plurality of driver IC chips mounted on the liquid crystal panel by a chip-on-glass (COG) mount technique. The liquid crystal panel has a matrix array of pixel electrodes and a plurality of signal lines formed along columns of the pixel electrodes, respectively. It is an aspect of the present invention that a power circuit, a gamma compensating circuit and a ground circuit are formed on the FPC film and are electrically connected to each of the drive IC chips, respectively. In addition, the plurality of driver IC chips used for driving the signal lines are connected in cascade for transmitting a clock signal and a display signal.

According to another aspect of the liquid crystal display device of the present invention, a power circuit, a gamma compensating circuit and a ground circuit can be formed on a printed circuit board (PCB) instead of the FPC film and be electrically connected to each of the drive IC chips respectively so as to achieve the object of the present invention.

The liquid crystal display device of the present invention provides the following advantages. Since the power circuit and the gamma compensating circuit are designed on the FPC film, voltage levels and gamma levels supplied to the driver IC chips will not generate voltage drops due to the wiring limitation of the glass substrate. Since the power circuit and the gamma compensating circuit are not required to be wired on the glass substrate, the peripheral area of the glass substrate can be reduced to facilitate the minimization of the liquid crystal display device. Since the driver IC chips are mounted on the glass substrate for facilitating the reduction of the FPC film in area, the dimension of the FPC film in width can be substantially equal to the dimension of the crystal liquid panel in thickness such that the FPC film can be folded to the side portion of the crystal liquid panel rather than the back portion so as to achieve the object of the compactness of the crystal liquid display device.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
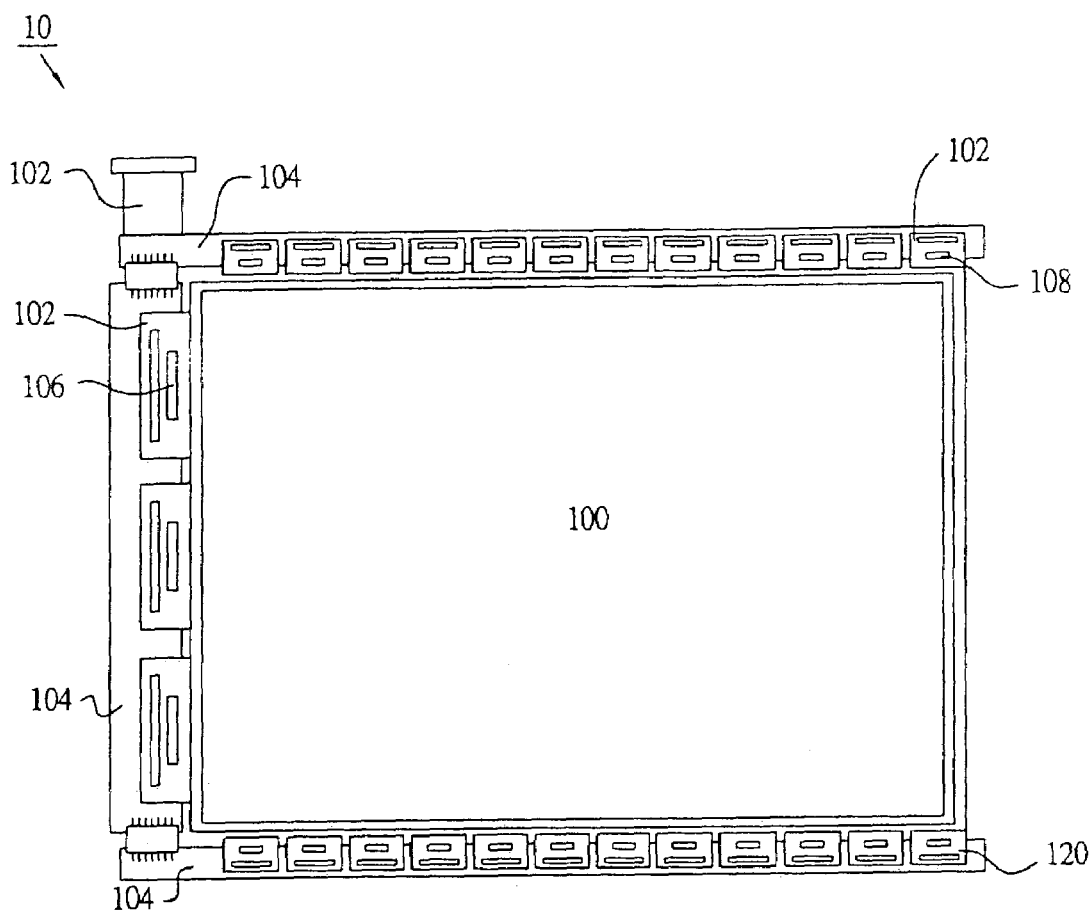
FIG. 1 is a plan view of a conventional liquid crystal display device.
Figure 2:
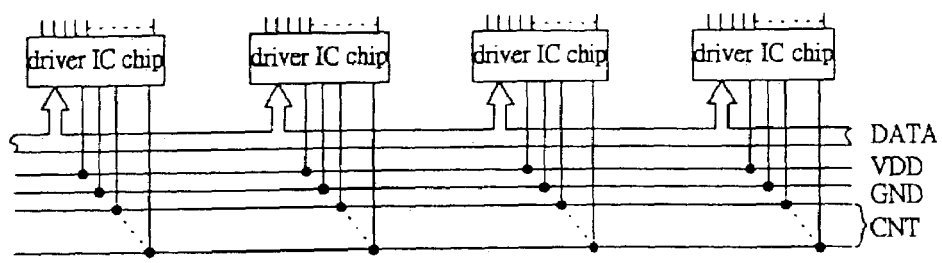
FIG. 2 is a block diagram schematically showing the wiring disposition of driver IC chips of a conventional liquid crystal display device.
Figure 3:
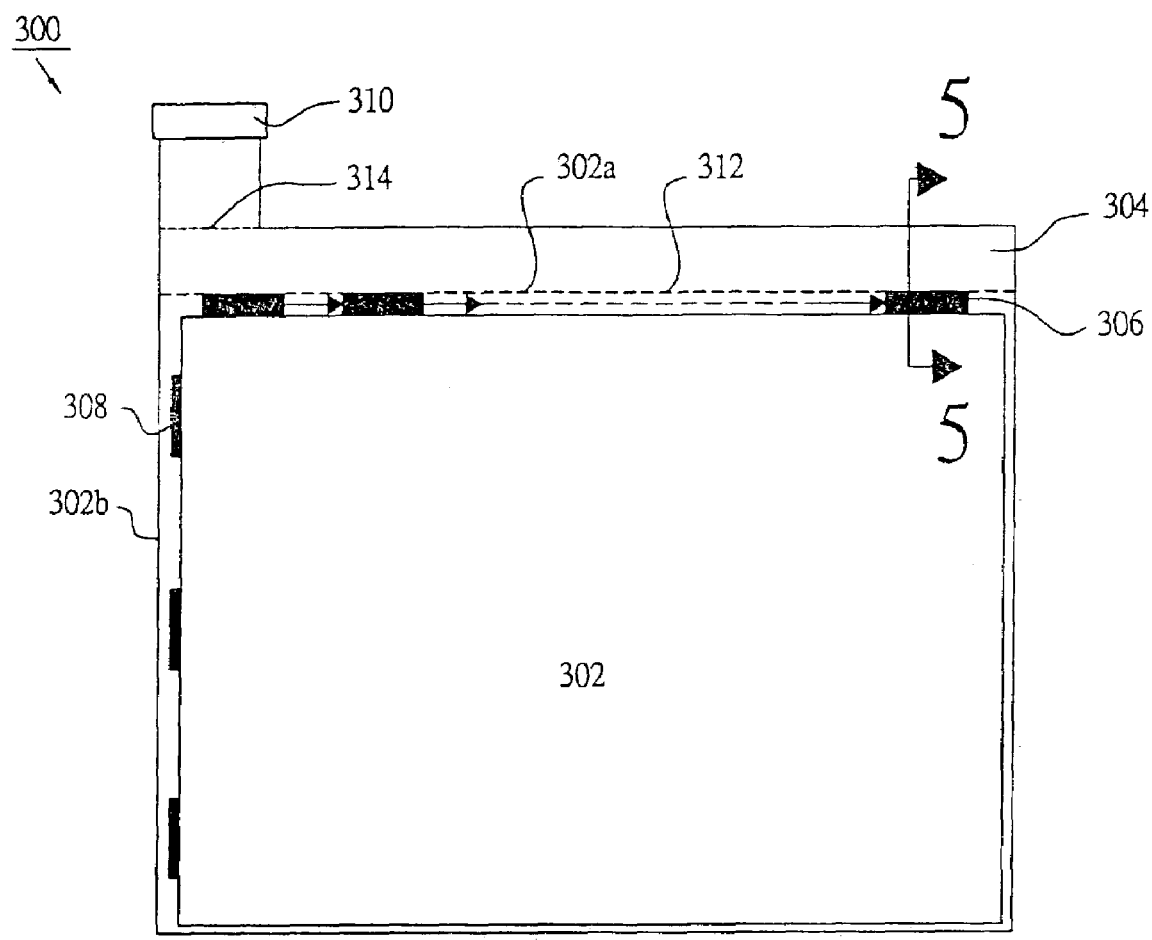
FIG. 3 is a plan view of a liquid crystal display device according to an embodiment of the present invention.

Referring to FIG. 3, it shows a liquid crystal display device 300 according to an embodiment of the present invention. The liquid crystal display device 300 mainly comprises a liquid crystal panel 302, a FPC film 304 connected to the liquid crystal panel 302, and a plurality of driver IC chips 306, 308 mounted on the liquid crystal panel 302, and an external controller 310 connected to the FPC film 304 for driving the driver IC chips 306, 308.

Those skills in the art should be understood that the liquid crystal panel 302 comprises a liquid crystal layer interposed between an array substrate and an opposite substrate. Both the array substrate and the opposite substrate of the liquid crystal panel 302 have a transparent glass plate used as a base material. The array substrate includes a matrix array of pixel electrodes, scanning lines respectively along the rows of these pixel electrodes, signal lines respectively formed along the columns of these pixel electrodes, and Thin Film Transistors (TFTs), serving as switching elements, respectively formed close to the intersections of the scanning lines and the signal lines. Each TFT has a gate connected to one scanning line, and a current path connected between one signal line and one pixel electrode.

Still referring to FIG. 3, according to the embodiment of the present invention, the liquid crystal display device 300 includes two types of driver IC chips 306, 308, wherein the driver chips 306 are mounted, in a row, on a periphery of one side 302a of the liquid crystal panel 302 for driving the signal lines, and the driver chips 308 are mounted, in a column, on a periphery of another side 302b, perpendicular to the side 312, of the liquid crystal panel 302 for driving the scanning lines.

The driver IC chips 306 and 308 are mounted on a glass substrate of liquid crystal panel 302 by a chip-on-glass (COG) mount technique. With such mount technique, thin film wirings are formed on the surface of the glass substrate of the liquid crystal panel 302 for connecting to contact points of the array substrate, and the dies are fixedly secured and welded on the thin film wirings by anisotropic conductive film (ACF). The detailed illustration related to the chip-on-glass technology can refer to U.S. Pat. No. 6,292,248 B1, issued on Sep. 18, 2001, which is incorporated herein by reference.

In general, the input lines of each driver IC chip 306 include one clock line, power lines, ground lines, gamma compensating lines, data lines and control signal lines. The liquid crystal display device 300 according to the present invention has one clock line, four power lines, two ground lines, fourteen gamma compensating lines, eighteen data lines, and four control signal lines; therefore, there are forty-three lines in total input to each of the driver IC chips 306.

It should be noted that the power lines are used for providing the driver IC chips 306 with power which is from the external controller 310, and that the gamma compensating lines are used for providing different voltages to compensate the nonlinear change of the gray level. Therefore, the power lines and the gamma compensating lines, preferably, have lower resistance values in order to prevent voltage drop from being caused by the resistance value when the power is provided to the driver IC chips 306, wherein the voltage drop may practically result in errors in voltage level and gamma level received by the driver IC chips 306. However, the thickness of a thin film wiring is far smaller, for example, than that of wiring made in a tape carrier package, and the width of the thin film wiring should be at least 20–30 $\mu$m so as to avoid generating relatively higher resistance value. Also, in conventional art, since all wirings are input from the longer side of each driver IC chip 306, the total contact points of the FPC film 304 and the liquid crystal panel are sixty-one. In general, since the manufacturing yield is inversely proportional to the number of the contact points, the yield must be limited in the conventional structure and technique.

Figure 4:
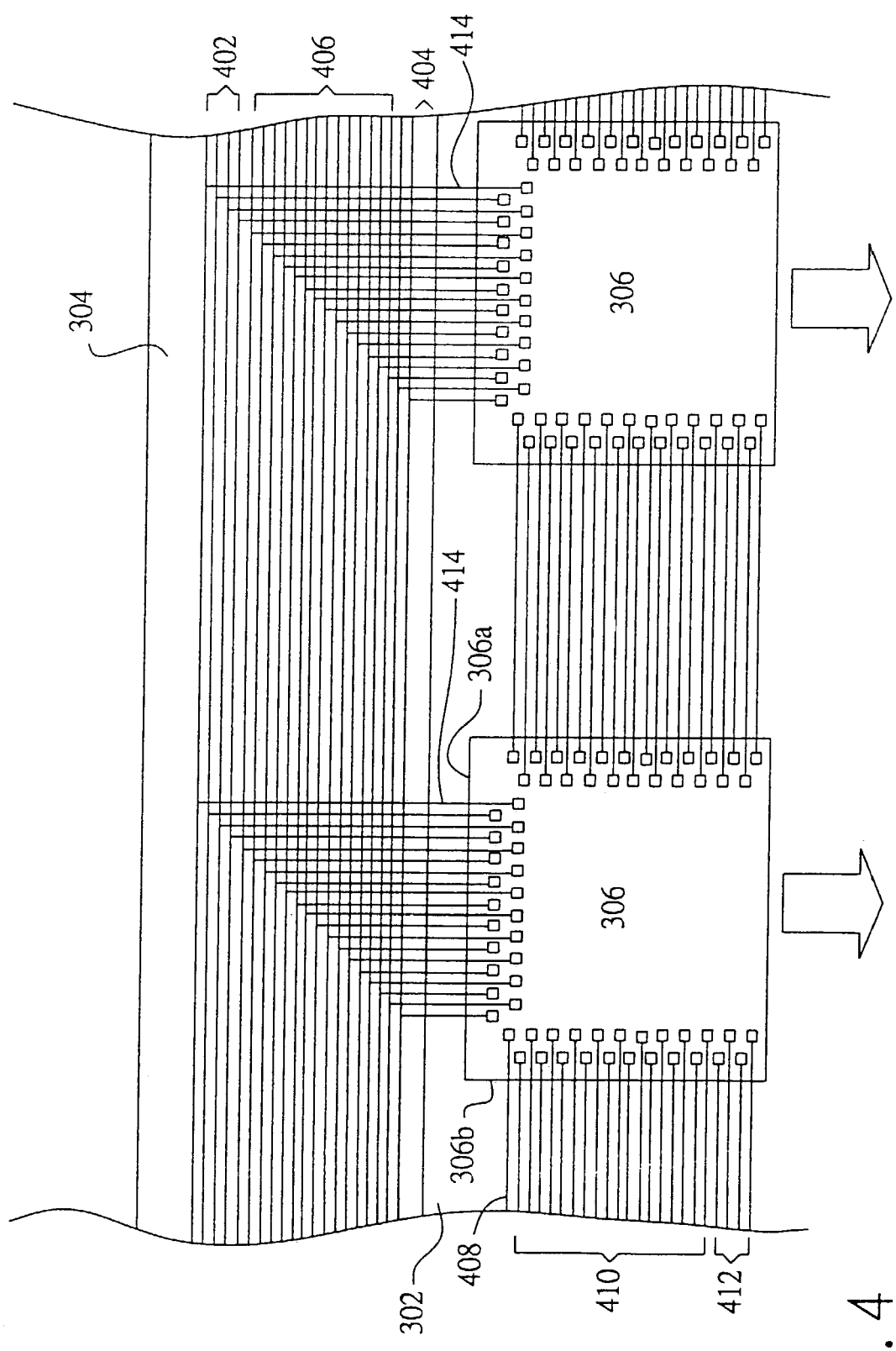
FIG. 4 is a partial plan view of the liquid crystal display device shown in FIG. 3 showing the wiring disposition between the driver IC chips and a FPC film.

In an aspect of the present invention, circuits for driving each driver IC chip 306 include two portions, as shown in FIG. 4. In the first portion, the power circuit 402 for controlling voltage, ground circuit 404, and gamma compensating circuit 406 are formed on the FPC film 304 and electrically connected to one longer side 306a of each driver IC chip 306 respectively. In the second portion, clock lines 408, data circuit 410, and control signal circuit 412 are formed on the glass substrate of the liquid crystal panel 302 by the thin film circuit method, and the driver IC chips 306 are connected in cascade on shorter sides 306b. More specifically, the longer side 306a of the driver IC chips 306 are connected to thin film wirings 414, and each thin film wiring 414 is respectively connected to the power circuit, ground circuit 404, and gamma compensating circuit 406 of the FPC film 304. According to the present invention, the length of the longer side 306a of the driver IC chips 306 is around 17 mm. If the length is divided into twenty thin film wirings connected to the power circuit 402, ground circuit 404, and gamma compensating circuit 406, the gap between each thin film wiring 414 can be up to 850 $\mu$m, and the width of the shorter side 306b of the driver IC chips 306 is around 1.2 mm. If the width is divided into twenty-three wirings of the clock line 408, data circuit 410, and control signal circuit 412, the gap between each wiring can be up to 52 $\mu$m. Therefore, the present invention provides enough gap width for forming enough width of thin film wiring to input the chips 306, and to improve the connection between the FPC film 304 and the liquid crystal panel.

In addition, the driver IC chips 306 are connected in cascade by the clock lines 408, data circuit 410, and control signal circuit 412 such that the space of the wiring disposition on the liquid crystal panel 302 can be effectively reduced so as to obtain a larger image display area or higher display resolution. Since the driver IC chips 306 are connected in cascade, the driver IC chips 306 further have functions for transmitting clock and displaying signal. Each driver IC chip 306 comprises an inner clock circuit, a first transmission path, and a second transmission path. The inner clock circuit is used for controlling the duty ratio of a clock signal. The first transmission path is used for providing the clock signal to the inner clock circuit so as to produce a regulated clock signal and supplying the regulated clock signal to a next one of the driver IC chips. The second transmission path is used for sequentially obtaining voltages of a display signal in synchronism with the clock signal, and supplying the obtained voltages of the display signal to predetermined number of signal lines.

In addition, the input signal lines are easily input to the driver IC chips 308. Since the signal lines according to the present invention only include four power lines, one ground line, three control signal lines, and two Vcom lines, which is ten signal lines in total, the signal lines input to the driver IC chips 308 can be formed directly on the glass substrate of the liquid crystal panel 302 by thin film circuit method so as to respectively connect with each driver IC chip 308; and the signal lines also can connect with the driver IC chips 308 in cascade.

Figure 5:
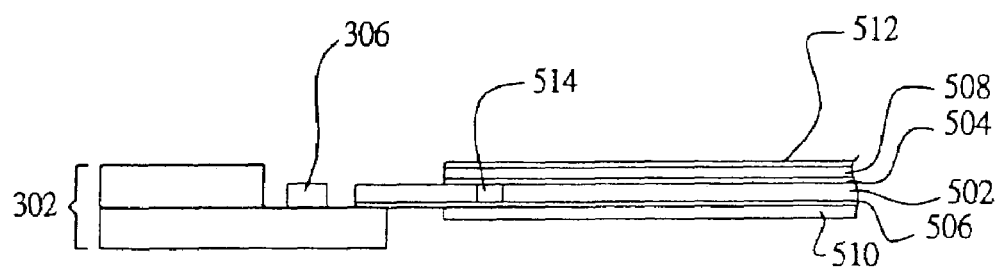
FIG. 5 is a cross-sectional view taken along line 5—5 of FIG. 3.
Figure 6:
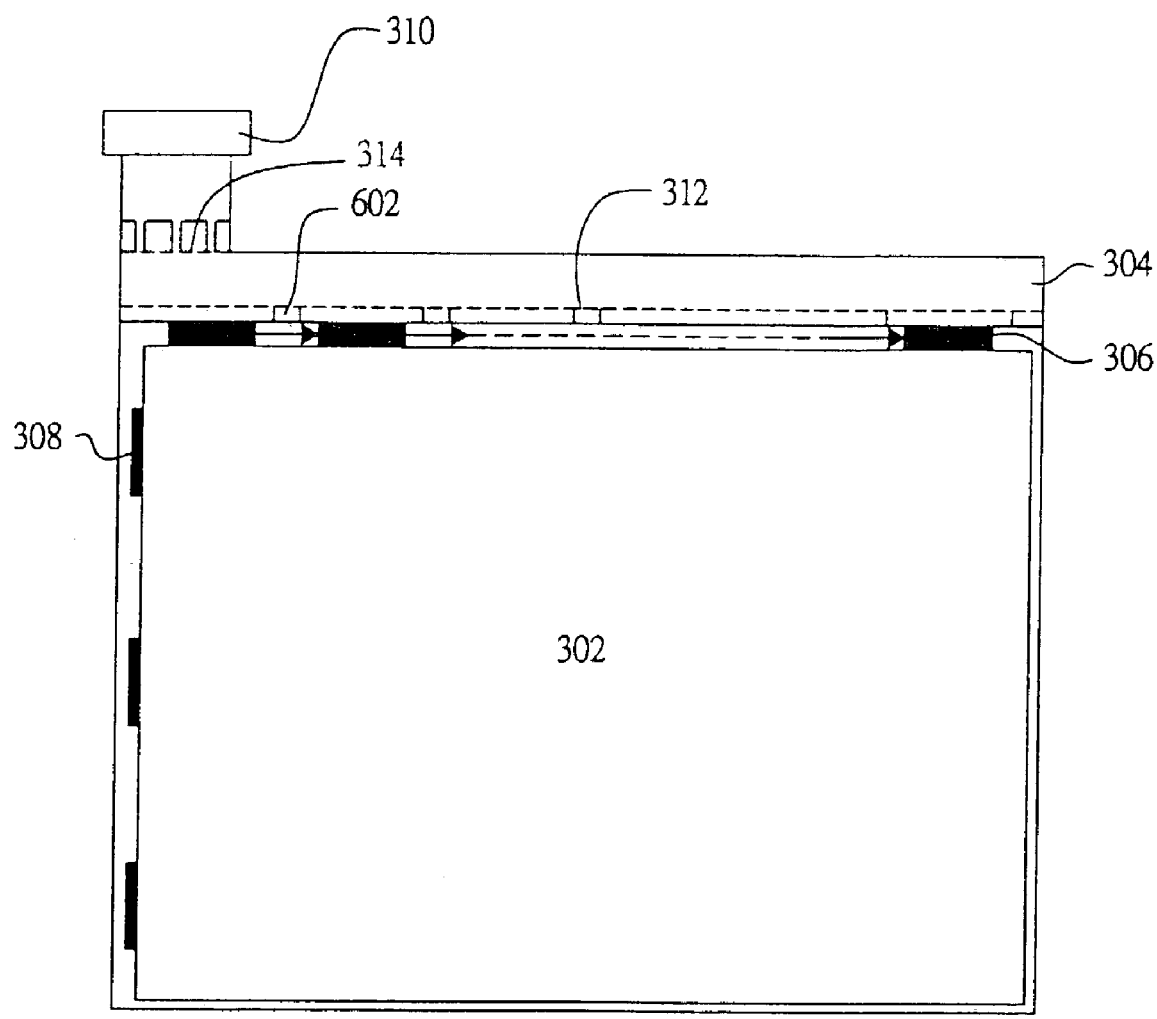
FIG. 6 is a plan view schematically showing a liquid crystal display device according to the other embodiment of the present invention.

According to an embodiment of the present invention, the FPC film 304 is used not only for accommodating the power lines 402, ground lines 404, and gamma compensating lines 406 but also for providing the external controller 310 to transmit signals to wirings mainly formed on the liquid crystal panel via the FPC film 304. FIG. 5 is a cross-sectional view taken along line 5—5 of FIG. 3. The FPC film 304 has a basic film 502 having an upper surface and a lower surface, made of polyimide (PI) material, and the upper surface and the lower surface have their respectively conductive wirings 504, 506 formed by a layer of copper. The conductive wirings 504, 506 electrically connect to each other via a through-hole 514 formed on the basic film and cover protective layers 508, 510, respectively, formed of polyimide material wherein each of protective layers 508, 510 has lower portion conductive wiring 506 exposed for connecting to the thin film wirings of the liquid crystal panel 302. It can be also required for the upper protective layer 508 to form a coated-layer ground 512. It should be noted that the FPC film 304 is a soft-type circuit board such that it can be folded on the side of the liquid crystal panel 302. Referring to FIG. 3, the FPC film 304 has a folded line 312 formed corresponding to the edge portion of the liquid crystal panel 302 such that the FPC film 304 can be tightly folded along the side of the liquid crystal panel 302. The connected portion of the FPC film 304 and the external controller 310 also has a folded line 314 so as to effectively save the space of the circuit board, and the dimension of the liquid crystal display device is substantially equal to that of the liquid crystal panel 302 so as to facilitate the minimization of the liquid crystal device. According to the embodiment of the present invention, the liquid crystal display device 300 has only one FPC film 304 so as to be folded easily. In addition, it can be seen in FIG. 5 that the FPC film 304 can connect with the liquid crystal panel 302 by only one layer of conductive wiring 506 and basic film 502 although the FPC film 304 has about two or three conductive wirings and multi-layer; and as a result of the reduction in thickness, the FPC film 304 can be easily and tightly folded along the side of the liquid crystal panel 302. Furthermore, the present invention also discloses another embodiment as shown in FIG. 6, it shows that the connected portion of the FPC film 304 and liquid crystal panel 302 has a plurality of voids 602 forming a saw-toothed edge so as to facilitate folding of the FPC film 304.

Figure 7:
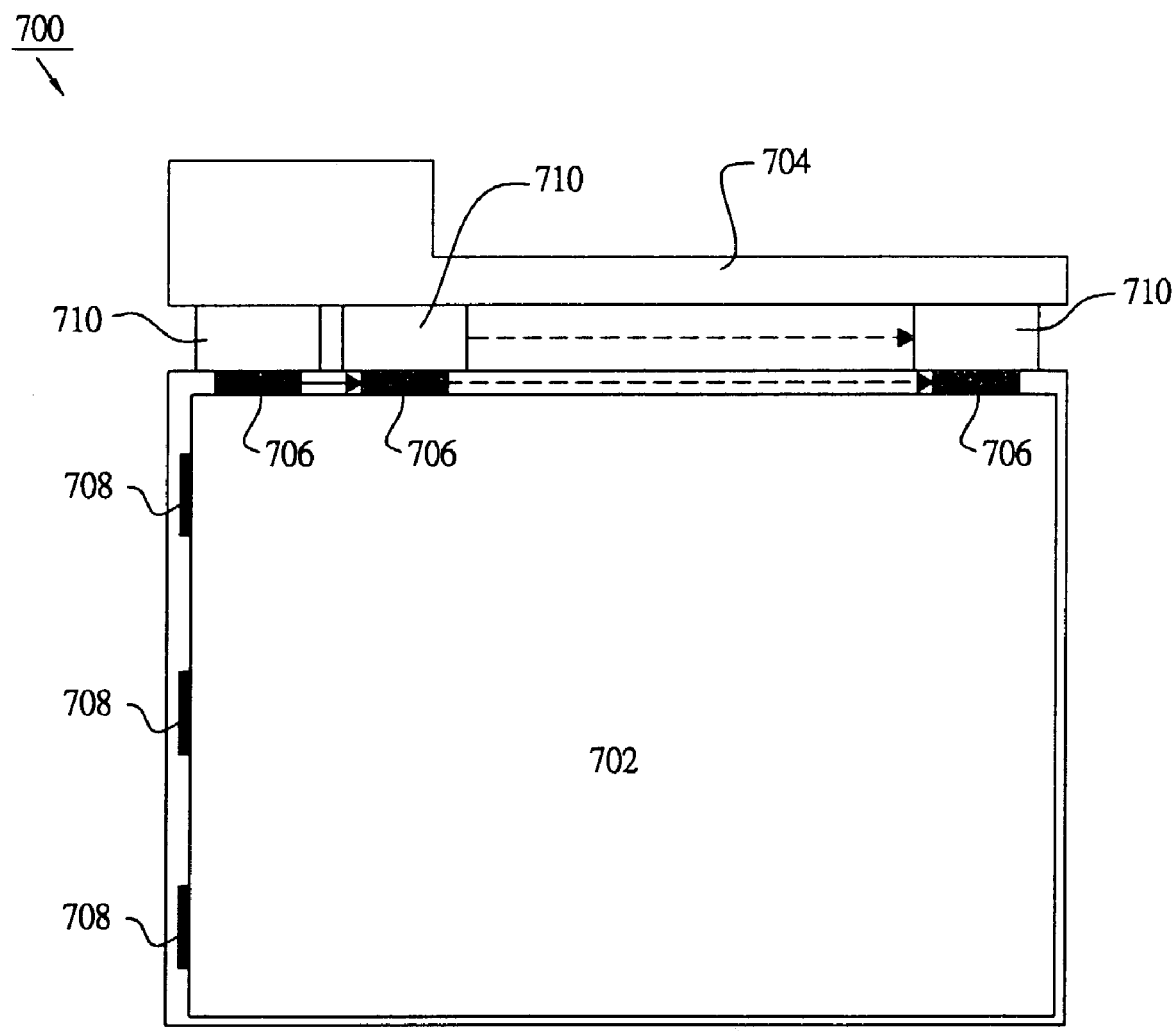
FIG. 7 is a plan view schematically showing a liquid crystal display device according to the other embodiment of the present invention.

FIG. 7 shows a liquid crystal display device 700 according to another embodiment of the present invention. The liquid crystal display device 700 mainly comprises a liquid crystal panel 702, a printed circuit board 704, a plurality of driver IC chips 706, 708 and a plurality of FPC films 710. The driver IC chips 706, 708 are mounted and configured on the liquid crystal panel 702 with the same manner as the driver IC chips 306, 308 on the liquid crystal panel 302 shown in FIG. 3. A power circuit, a gamma compensating circuit and a ground circuit are formed on the printed circuit board 704 and connected to each of the driver IC chips 706 through each one of the plurality of FPC films 710 respectively. The only difference between the embodiment of FIG. 3 and the embodiment of FIG. 7 is that the power circuit, the gamma compensating circuit and the ground circuit are formed on the printed circuit board 704 instead of the FPC film 304 and connected to each of the drive IC chips through respective FPC films 710 instead of the thin film wirings 414 shown in FIG. 4.

The connections (thin film wiring 414) between the FPC film 304 and the IC chips 306 shown in FIG. 3 will not easy be precisely completed due to a thermal expansion of the FPC film 304 while a liquid crystal display device is larger than 15 inch in dimension. In addition, it should be understood that a coefficient of thermal expansion (CTE) of a printed circuit board is generally smaller than that of a FPC film. Therefore, the embodiment of the present invention in FIG. 7 is preferably applied to a larger liquid crystal panel (larger than 15 inch in dimension) so as to avoid the problem caused by the thermal expansion and increase the precision of the connections between the power circuit, the gamma compensating circuit and the ground circuit and the IC chips.

It should be noted that the connections between the printed circuit board 704 and the IC chips 706 can be completed through any kind of soft-type circuit board (e.g. flexible printed board) such that the printed circuit board 704 can be folded on the side or on the back of the liquid crystal panel 702.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A liquid crystal display device, comprising:
    a liquid crystal panel, wherein the liquid crystal panel comprises a glass substrate having a matrix array of liquid crystal pixel electrodes, a plurality of scanning lines respectively formed along rows of the liquid crystal pixel electrodes, and a plurality of signal lines respectively formed along columns of the liquid crystal pixel electrodes;
    a plurality of driver IC chips each being formed on the glass substrate and having a first side and a second side, and each of the driver IC chips being configured for driving a predetermined number of the signal lines; and
    a flexible printed circuit (FPC) film connected to the liquid crystal panel, the flexible printed circuit film having a power circuit, a gamma compensating circuit and a ground circuit formed thereon,
    wherein the driver IC chips are connected in cascade on the first sides for transmitting clock signals and display signals; and
    wherein the power circuit, the gamma compensating circuit and the ground circuit are electrically connected to the second sides of the driver IC chips.

2. The liquid crystal display device as claimed in claim 1, wherein the connected portion of the flexible printed circuit film and the liquid crystal panel has a plurality of voids.

3. The liquid crystal display device as claimed in claim 1, wherein the flexible printed circuit film has a folded line formed corresponding to the edge portion of the liquid crystal panel.

4. A liquid crystal display device, comprising:
    a liquid crystal panel comprising a pair of glass substrates between which a liquid crystal layer is sandwiched, wherein one of the glass substrates is an array substrate;
    a plurality of scanning lines formed in rows and a plurality of signal lines formed in columns on the array substrate, wherein the scanning lines and the signal lines together form a plurality of pixel electrodes arranged as a matrix array;
    a plurality of driver IC chips each being formed on the array substrate and having a first side and a second side; and
    a flexible printed circuit (FPC) film connected to the liquid crystal panel and having a plurality of wirings formed thereon, wherein the plurality of wirings comprise a power circuit, a gamma compensating circuit and a ground circuit;
    wherein the driver IC chips are connected in cascade on the first sides for transmitting clock signals and display signals; and
    wherein the power circuit, the gamma compensating circuit and the ground circuit are electrically connected to the second sides of the driver IC chips.

5. The liquid crystal display device as claimed in claim 4, the driver IC chips are used for driving a predetermined number of the signal lines.

6. The liquid crystal display device as claimed in claim 4, wherein the connected portion of the flexible printed circuit film and the liquid crystal panel has a plurality of voids.

7. The liquid crystal display device as claimed in claim 4, wherein the flexible printed circuit film has a folded line formed corresponding to the edge portion of the liquid crystal panel.

8. A liquid crystal display device, comprising:
a liquid crystal panel, wherein the liquid crystal panel comprises a glass substrate having a matrix array of liquid crystal pixel electrodes, a plurality of scanning lines respectively formed along rows of the liquid crystal pixel electrodes, and a plurality of signal lines respectively formed along columns of the liquid crystal pixel electrodes;
a plurality of driver IC chips each being formed on the glass substrate and having a first side and a second side, and each of the driver IC chips being configured for driving a predetermined number of the signal lines;
a plurality of flexible printed circuit (FPC) films; and
a printed circuit board having a power circuit, a gamma compensating circuit and a ground circuit formed thereon,
wherein the driver IC chips are connected in cascade on the first sides for transmitting clock signals and display signals; and
wherein the power circuit, the gamma compensating circuit and the ground circuit are electrically connected to the second side of each of the driver IC chips through one of the flexible printed circuit films, respectively.

9. A liquid crystal display device, comprising:
a liquid crystal panel comprising a pair of glass substrates between which a liquid crystal layer is sandwiched, wherein one of the glass substrates is an array substrate;
a plurality of scanning lines formed in rows and a plurality of signal lines formed in columns on the array substrate, wherein the scanning lines and the signal lines together form a plurality of pixel electrodes arranged as a matrix array;
a plurality of driver IC chips each being formed on the array substrate and having a first side and a second side, and each of the driver IC chips being configured for driving a predetermined number of the signal lines;
a plurality of flexible printed circuit films; and
a printed circuit board having a power circuit, a gamma compensating circuit and a ground circuit formed thereon,
wherein the driver IC chips are connected in cascade on the first sides for transmitting clock signals and display signals; and
wherein the power circuit, the gamma compensating circuit and the ground circuit are electrically connected to the second side of each of the driver IC chips through one of the flexible printed circuit films, respectively.

10. A liquid crystal display device, comprising:
a liquid crystal panel, wherein the liquid crystal panel comprises a glass substrate having a matrix array of liquid crystal pixel electrodes, a plurality of scanning lines respectively formed along rows of the liquid crystal pixel electrodes, and a plurality of signal lines respectively formed along columns of the liquid crystal pixel electrodes;
a plurality of driver IC chips formed on the glass substrate and connected to each other in cascade for transmitting clock signals and display signals, each of the driver IC chips being configured for driving a predetermined number of the signal lines; and
a flexible printed circuit (FPC) film connected to the liquid crystal panel, the flexible printed circuit film having a power circuit, a gamma compensating circuit and a ground circuit formed thereon, wherein the power circuit, the gamma compensating circuit and the ground circuit are electrically connected to each of the driver IC chips, respectively;
wherein the FPC film is folded along a side of the liquid crystal panel without being folded on the back of the liquid crystal panel, thereby reducing the overall thickness of the liquid crystal display device.

11. The liquid crystal display device as claimed in claim 10, wherein the connected portion of the FPC film and the liquid crystal panel has a plurality of voids.

12. The liquid crystal display device as claimed in claim 10, wherein the FPC film has a folded line formed corresponding to the edge portion of the liquid crystal panel.

13. The liquid crystal display device as claimed in claim 1, wherein adjacent ones of said driver IC chips are cascade connected by elongated conductors which are located in a spacing between adjacent edges of said adjacent driver IC chips.

14. The liquid crystal display device as claimed in claim 4, wherein adjacent ones of said driver IC chips are cascade connected by elongated conductors which are located in a spacing between adjacent edges of said adjacent driver IC chips.

15. The liquid crystal display device as claimed in claim 8, wherein adjacent ones of said driver IC chips are cascade connected by elongated conductors which are located in a spacing between adjacent edges of said adjacent driver IC chips.

16. The liquid crystal display device as claimed in claim 9, wherein adjacent ones of said driver IC chips are cascade connected by elongated conductors which are located in a spacing between adjacent edges of said adjacent driver IC chips.

17. The liquid crystal display device as claimed in claim 13, wherein the wirings of the flexible printed circuit film define a bus common to said driver IC chips.

18. The liquid crystal display device as claimed in claim 17, wherein some of the elongated conductors define a data circuit for transmitting the display signals, which are intended for the signal lines, between the cascade connected driver IC chips.

* * * * *